United States Patent [19]

Chang et al.

[11] Patent Number: 5,674,768
[45] Date of Patent: Oct. 7, 1997

[54] METHOD OF MAKING FLASH EEPROM CELL HAVING FIRST AND SECOND FLOATING GATES

[75] Inventors: Sang Hwan Chang, Pohang; Sung Oh Han, Kyungki-do, both of Rep. of Korea

[73] Assignee: Hyundai Electronics Industories Co., Ltd., Kyungki-do, Rep. of Korea

[21] Appl. No.: 620,894

[22] Filed: Mar. 22, 1996

[30] Foreign Application Priority Data

Mar. 22, 1995 [KR] Rep. of Korea ............ 95-6086

[51] Int. Cl.⁶ ................................. H01L 21/8247
[52] U.S. Cl. ................ 437/43; 437/44; 437/50
[58] Field of Search ................ 437/43, 44, 49, 437/50, 191

[56] References Cited

U.S. PATENT DOCUMENTS

| | | | |
|---|---|---|---|
| 4,988,635 | 1/1991 | Ajika et al. | 437/43 |
| 5,045,491 | 9/1991 | Gill et al. | 437/50 |
| 5,378,643 | 1/1995 | Ajika et al. | 437/43 |
| 5,429,969 | 7/1995 | Chang | 437/43 |

*Primary Examiner*—Chandra Chaudhari
*Attorney, Agent, or Firm*—Fish & Richardson, P.C.

[57] ABSTRACT

This invention relates to a Flash EEPROM (Electrically erasable programmable Read-Only Memory) cell and manufacturing methods thereof, especially which is capable of three different output levels by the variation of effective channel length depending on whether either or all of two floating gates are programmed or erased and the combination of bias, in which two floating gates are formed on a channel region.

2 Claims, 2 Drawing Sheets

METHOD OF MAKING FLASH EEPROM CELL HAVING FIRST AND SECOND FLOATING GATES

BACKGROUND OF THE INVENTION

1. Field of the Invention

This invention relates to a Flash EEPROM (Electrically erasable programmable Read-Only Memory) cell and manufacturing methods thereof, especially which is capable of three different output levels by the variation of effective channel length depending on whether either or all of two floating gates are programmed or erased and the combination of bias, in which two floating gates are formed on a channel region.

2. Information Disclosure Statement

An EEPROM semiconductor device which has the function of electrical program and erasure has gaining wide acceptance in market due to its unique advantages. But the EEPROM device requires higher manufacturing cost per bit so that the cost should be reduced by increasing the integration degree of cell. By the way, there are many difficulties in integrating the EEPROM cell because it has a relatively complicated structure compared with a DRAM cell.

SUMMARY OF THE INVENTION

Therefore, it is an object of the present invention to provide an EEPROM cell and manufacturing methods thereof to solve the above problems by getting three different output levels with the variation of effective channel length relying on whether either or all of two floating gates formed on a channel region are programmed or erased and the combination of bias.

To accomplish the above object, an EEPROM cell according to the invention comprises a first and a second floating gate that are isolated electrically from a silicon substrate by an underlying tunnel oxide film and are formed to be parallely adjancet to each other, a dielectric film spacer between the first floating gate and the second floating gate, a control gate formed on the first floating gate and the second floating gate in which the control gate is electrically isolated from the first and second floating gates, a source and a drain region formed on the silicon substrate to overlap with a portion of both ends of the floating gates.

A method of manufacturing an EEPROM cell, comprises the steps of: forming a first tunnel oxide film on a silicon substrate, forming a first polysilicon pattern to define the width and ond side of a first floating gate, forming a dieielectric film spacer at a wall of the first polysilicon pattern, forming a second tunnel oxide on the resulting structure, forming a second polysilicon pattern to define the width and one side of a second floating gate at a location parallel to the first polysilicon pattern, sequentially forming a dielectric film and a third polysilicon film, forming a control gate by etching the third polysilicon film using a mask for the control gate in which the other side of the first and second polysilicon patterns are consecutively etched, forming a source and a drain region on the silicon substrate using an ion implant process.

BRIEF DESCRIPTION OF THE DRAWING

For fuller understanding of the nature and objects of the invention, reference should be had to the following detailed description taken in conjunction with the accompanying drawings in which.

Similar reference characters refer to similar parts through the several views of the drawings.

DETAILED DESCRIPTION OF THE INVENTION

FIG. 1A through FIG. 1D are cross-sectional views of a device to explain manufacturing methods of a Flash EEPROM cell according to the invention.

Figure 1A:
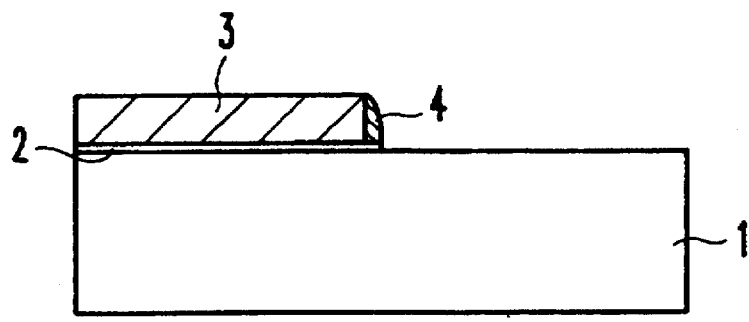
FIG. 1A through FIG. 1D illustrate cross-sectional views of a Flash EEPROM cell manufactured according to the invention.

In FIG. 1A, a first tunnel oxide (2) and a first polysilicon film are sequentially formed on a silicon substrate (1). The first polysilicon is patterned to define the width and one side of a first floating gate, thereby forming a first polysilicon pattern (3). A dielectric film spacer (4) is formed at an etched wall of the firt polysilicon pattern (3). The first polysilicon pattern (3) is formed in an active region (A) as shown in FIG. 1.

Figure 1B:
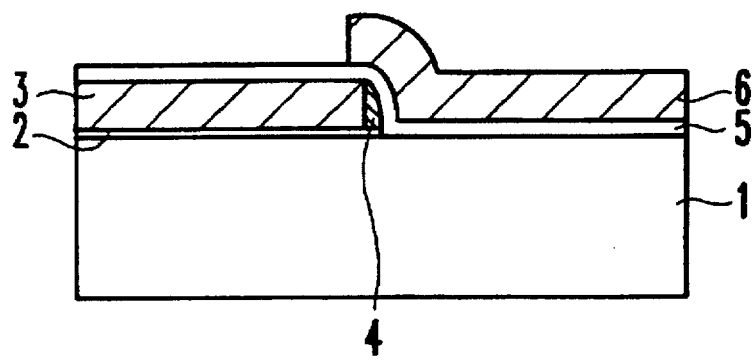
Figure 2:
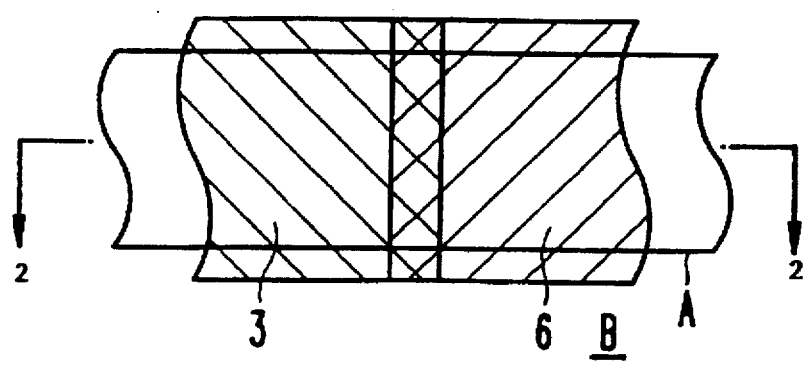
FIG. 2 is a top plan view of FIG. 1B.

Referring to FIG. 1B, a second tunnel oxide (5) and a second polysilicon are sequentially formed on the resulting structure after forming the dielectric film spacer (4), and the second polysilicon is then patterned to define the width and one side of a second floating gate, thereby forming a second polysilicon pattern (6). And also FIG. 1B is a cross-sectional view taken along line 2—2 of FIG. 2. As shown in FIG. 2, the second polysilicon pattern (6) is formed on the remaining area of the active region (A) excepting the region in which the first polysilicon pattern (3) is formed, wherein one side defined by the second polysilicon pattern (6) is overlapped with one side defined by the first polysilicon pattern. The first and second polysilicon patterns (3 and 6) extend to a field region (B) to cover the active region (A) fully.

Figure 1C:
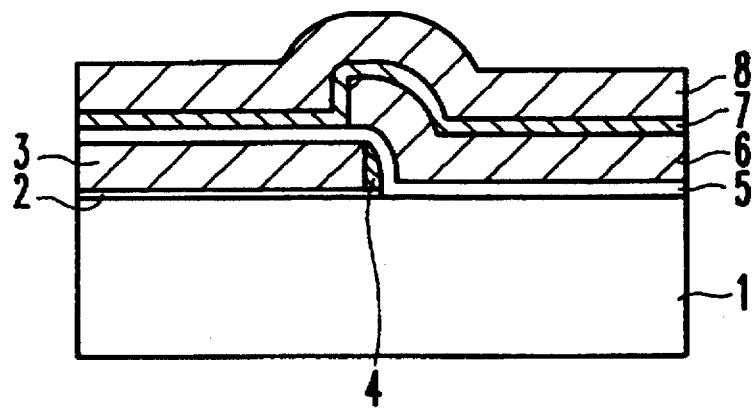

A dielectric film (7) and a third polysilicon film are sequentially deposited as shown in FIG. 1C.

Figure 1D:
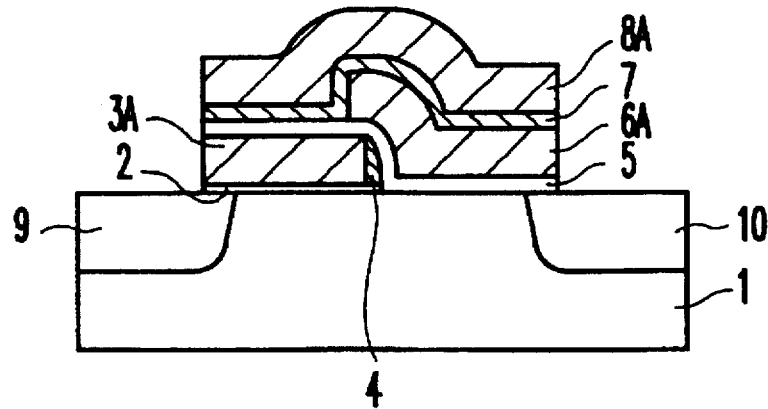

In FIG. 1D, a control gate (8A) is formed by etching the third polysilicon film (8) using a mask for the control gate (not shown). At the same time, the dielectric film (7), the second polysilicon pattern (6), the second tunnel oxide (5), the first polysilicon pattern (3), and the first tunnel oxide (2) are sequentially etched by a self-aligning etching method using the mask for the control gate. And then a source and a drain (10 and 9) are formed in the silicon substrate (1) by an ion implant process. As illustrated above, by the self-aligning etching method using the mask for the control gate, the other side of the first and the second polysilicon patterns (3 and 6) are defined to become a first and a second floating gate (3A and 6A) that are adjacent parallelly to the active region (A).

The advantages of the invention are as follows. As the saturation current of a metal oxide semiconductor (MOS) transistor is varied with the channel length of it, when effective channel length is altered, the saturation current varies accordingly so that different saturation current levels mighe be used for different logic levles. The present invention is capable of three different output levels. For example, if three (3) cells are required to get eight (8) kinds of different outputs in a conventional design, only two (2) cells are needed to get nine (9) different outputs according to this invention so that the integration of a device can be greatly increased.

Figure 3A:
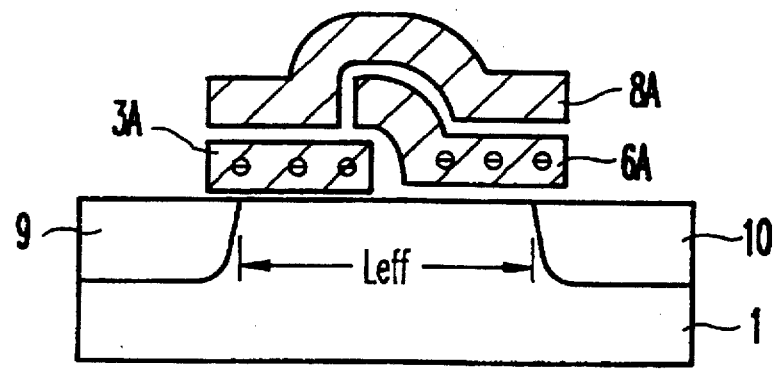
FIGS. 3A through 3C are cross-sectional views of a device to explain the operation of the Flash EEPROM cell according to the invention.
Figure 3B:
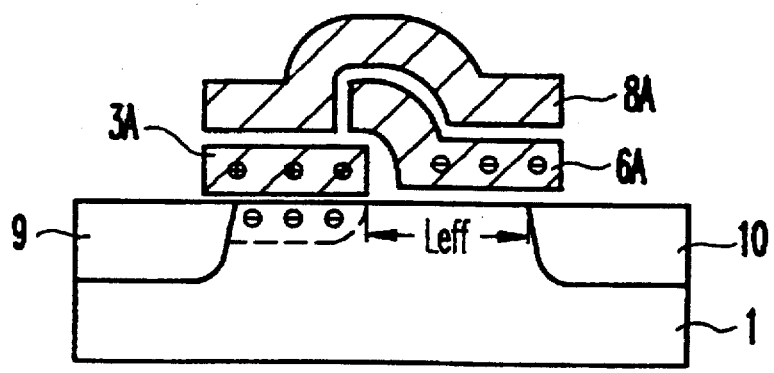
Figure 3C:
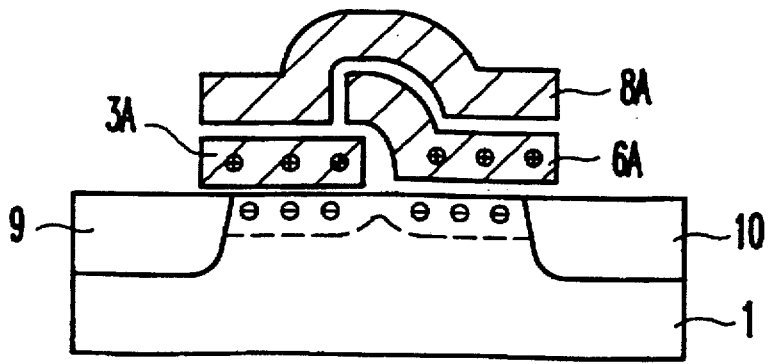

Reference is now made to FIG. 3A through FIG. 3C which show the operation of a Flash EEPROM cell manufactured as shown above to make use of this technical principle.

To program the cell, that is, to store charges in the floating gate, a ground potential is applied to a source (10) and a drain (9) and a high voltage of about +12 voltage is set to a control gate (8A). Then a first and a second floating gate (3A and 6A) are simultaneously programmed. In an erasing operation, when the source (10) and the drain (9) are set to 5 V and the control gate (8A) is set to −12 volt, charges stored at the first and the second floating gate (3A and 6A) are extracted by tunneling, as shown in FIG. 3C. To program only one floating gate of the first or the second floating gate (3A and 6A) in similar way, after programming the first and the second floating gate (3A and 6A) in the same way shown in FIG. 3A, setting the source (10), the drain (9), and the control gate (8A) to 0 V, 5 V and −12 V respectively make the first floating gate (3A) erased as shown FIG. 3B. Inversely, it's possible to erase the second floating gate (6A).

The conditions in which programmed data are read are classified into three types as shown above, (1) in case both of two floating gates are programmed, (2) when a floating gate is programmed while the other floating gate is erased, (3) when both of two floating gates are erased.

Of above three types, the read operation of the second type (e.g., the condition in which said first floating gate (3A) is erased is assumed) will be explained as follows.

If Vtp (threshold voltage for the first type) is applied to the control gate (8A), a channel under the first floating gate (3A) is sufficiently inversed to form a virtual drain. In this case, the virtual drain produces the same effect that the channel length is reduced as much as the length of the first floating gate, so that more saturation current flows compared with that of the first type. Therefore using this principle of the present invention, a Flash EEPROM cell in which three different outputs may be acquired using above three types can be accomplished.

As described above in detail, when the present invention is applied, different saturation current levels can be acquired with the variation of the channel length, and it can produces three different output levels so that there are dominant effects on increasing the integration of a device with no added cost.

The foregoing description, although described in its preferred embodiment with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. The method of manufacturing an EEPROM cell, comprising the steps of:

forming a first tunnel oxide film on a silicon substrate;

forming a first polysilicon pattern to define the width and one side of a first floating gate;

forming a dielectric film spacer at a wall of said first polysilicon pattern;

forming a second tunnel oxide on the resulting structure after forming said dielectric film spacer;

forming a second polysilicon pattern to define the width and one side of a second floating gate at a location parallel to said first polysilicon pattern;

sequentially forming a dielectric film and a third polysilicon film;

forming a control gate by etching said third polysilicon film using a mask for the control gate in which the other side of the first and second polysilicon patterns are consecutively etched; and forming a source and a drain region on the silicon substrate using an ion implant process.

2. The method of claim 1, wherein one side of said second floating gate overlaps with one side of said first floating gate.

* * * * *